United States Patent [19]

Pfaff

[11] 4,370,805
[45] Feb. 1, 1983

[54] CIRCUIT PACKAGE HANDLING APPARATUS

[75] Inventor: Wayne K. Pfaff, Irving, Tex.

[73] Assignee: Plastronics Interconnections, Inc., Irving, Tex.

[21] Appl. No.: 198,543

[22] Filed: Oct. 20, 1980

[51] Int. Cl.³ .......................... B23P 19/00; H05K 3/30
[52] U.S. Cl. ...................................... 29/741; 414/224; 414/736
[58] Field of Search ................. 29/741, 759, 837, 838, 29/839, 566.3; 414/224, 225, 736, 744 A; 324/73 PC

[56] References Cited

U.S. PATENT DOCUMENTS

| | | | |
|---|---|---|---|
| 3,508,315 | 4/1970 | Hoffken | 29/741 |
| 3,710,479 | 1/1973 | Bernardo et al. | 29/741 |
| 3,937,167 | 2/1976 | Warren | 414/736 |
| 3,963,456 | 6/1976 | Tsuchiya et al. | 221/264 |
| 4,102,043 | 7/1978 | Andrade et al. | 29/739 |
| 4,179,803 | 12/1979 | Wolkert | 29/741 |
| 4,250,615 | 2/1981 | Knuth et al. | 29/741 |
| 4,304,514 | 12/1981 | Pfaff | 414/224 |

*Primary Examiner*—Carl E. Hall
*Assistant Examiner*—P. W. Echols
*Attorney, Agent, or Firm*—Kanz & Timmons

[57] ABSTRACT

Disclosed is apparatus for aligning a plurality of circuit packages in a row and transferring the row of circuit packages to a corresponding row of receiving sockets in a burn-in board. The apparatus includes a transfer arm carrying a transfer rack pivotal about a non-rotatable shaft which moves axially to raise and lower the transfer arm. The transfer rack includes a plurality of reciprocal blades adapted to receive the circuit packages therebetween and transfer them to the receiving sockets. The reciprocal blades are retracted to release the circuit packages and the pins on the circuit packages are inserted into the sockets by spring loaded plungers positioned intermediate the blades.

22 Claims, 8 Drawing Figures

CIRCUIT PACKAGE HANDLING APPARATUS

This invention relates to apparatus for handling electronic circuit packages. More particularly, it relates to apparatus for rapidly and simultaneously inserting or loading a plurality of electronic circuit packages into sockets on burn-in boards and the like.

In the semiconductor electronics industry, various semiconductor components are packaged in standard component packages. One such standard package is the dual in-line package (known as a DIP) which essentially comprises an enclosed package containing the semiconductor component with parallel rows of leads extending from opposite edges of the package. With the advent of large scale integration, which allows several hundred TTL transistors and as much as sixty-four thousand memory elements on a single semiconductor chip housed in a DIP, it has become common practice to test every DIP. Standard testing procedures usually include mounting a plurality of DIPs on a test board, known as a burn-in board, and simultaneously subjecting the units to various environmental and electrical stresses while mounted on the burn-in board. The DIPs are then removed or unloaded from the burn-in board and tested. Those units failing the functional tests are discarded or classified according to test performance.

Since it is desirable to burn-in or test the entire production output from an assembly line of DIPs, it is desirable that the loading and unloading of the burn-in board be accomplished as rapidly and economically as possible. For this purpose, and to aid in rapidly testing the units, various configurations of burn-in boards are employed. Although the configuration of the burn-in board may vary for various reasons, all burn-in boards generally arrange the DIPs in closely spaced sockets aligned in rows and columns on the board with the number, spacing and alignment of the sockets varying according to particular testing methods, etc. The DIPs may, of course, be loaded in the burn-in boards by hand. This method, however, is extremely time-consuming and therefore expensive. Automatic equipment has also been developed for automatically loading burn-in boards. However, automatic equipment is generally quite expensive and frequently causes mechanical damage to the DIP simply because bent leads or the like may not be in proper registry with the burn-in board sockets and thus become damaged when an attempt is made to automatically insert them into the sockets on the board. Furthermore, if the leads are not properly aligned with the sockets on the burn-in board, the leads may be bent or the DIP package itself irreparably damaged. Accordingly, failure to accurately locate the DIP pins with respect to the sockets in the burn-in board frequently causes bending of the DIP pins which either necessitates a pin straightening procedure in association with the burn-in board loading operation or causes irreparable damage to the DIP.

In accordance with the present invention, apparatus is provided which automatically places a quantity of DIPs in registry with an equal number of sockets on a burn-in board and inserts the pins into the sockets. However, in accordance with the present invention, the pressure applied to the DIP during insertion into the burn-in board is limited so that no damage may be done to a DIP on which the leads are not in registry with the sockets. Accordingly, if a bent lead or the like prevents proper insertion of the DIP into the socket, the DIP is not damaged nor is the bent pin further damaged. The DIP merely rests atop the socket and may be readily removed by hand or otherwise for corrective measures without damaging the DIP and without stopping or slowing the loading operation.

The apparatus of the invention comprises a table for mounting the burn-in board and a transfer arm for simultaneously transferring a plurality of DIPs from an alignment rack to the burn-in board and inserting the DIPs into the burn-in board sockets. The transfer arm carries a transfer rack including a plurality of spaced parallel blades or fingers which engage the DIP on opposite sides thereof and individual spring-loaded plunger means for inserting each DIP into its respective socket when properly aligned. The amount of pressure applied to the DIP body while inserting the pins is limited to the pressure exerted by the spring-loaded insertion means, thus each DIP is individually loaded and no DIP can be damaged by the loading apparatus. The apparatus may be conveniently and relatively inexpensively manufactured and manually operated to provide semi-automatic package loading which is as rapid as many automatic loaders but at substantially lower costs. Furthermore, the loading process is not stopped or delayed when a bent pin is encountered and the loading apparatus cannot damage a circuit package even if the package or socket is mis-aligned or if the pins on the package are bent.

Other features and advantages of the invention will become more readily understood from the following detailed description taken in connection with the appended claims and attached drawings in which:

Figure 1:
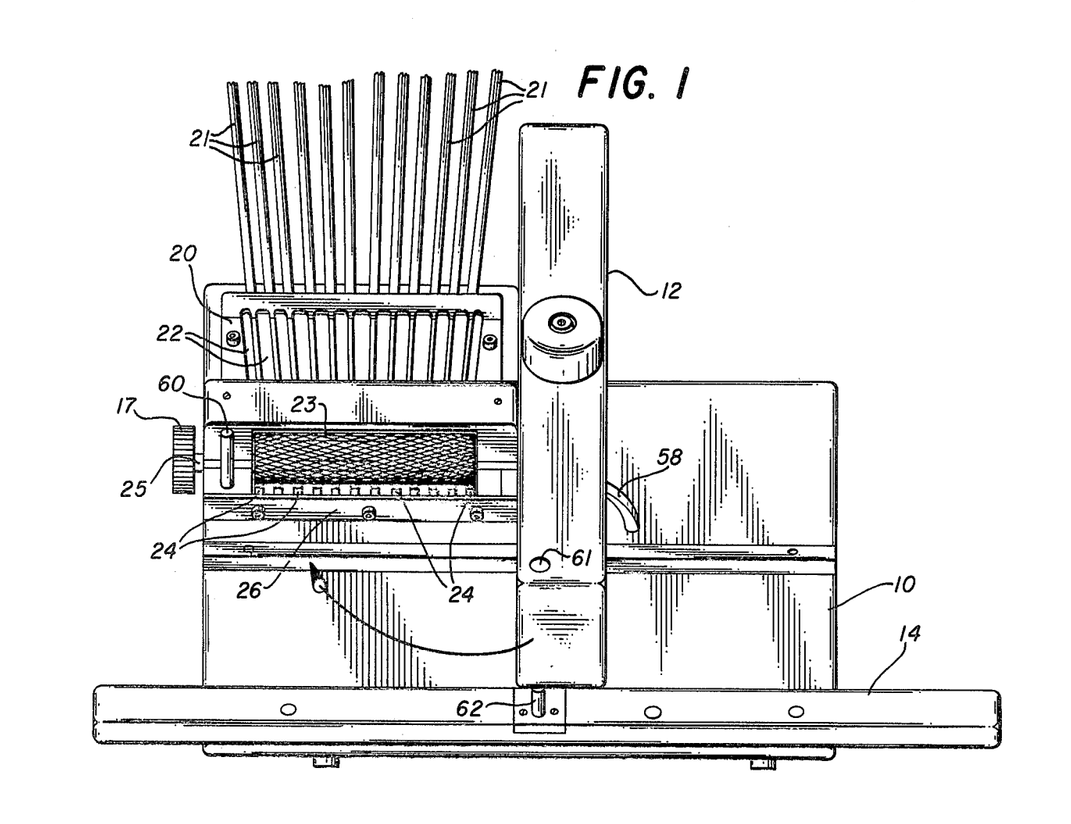
FIG. 1 is a perspective view of the preferred embodiment of apparatus employing the invention.
Figure 2:
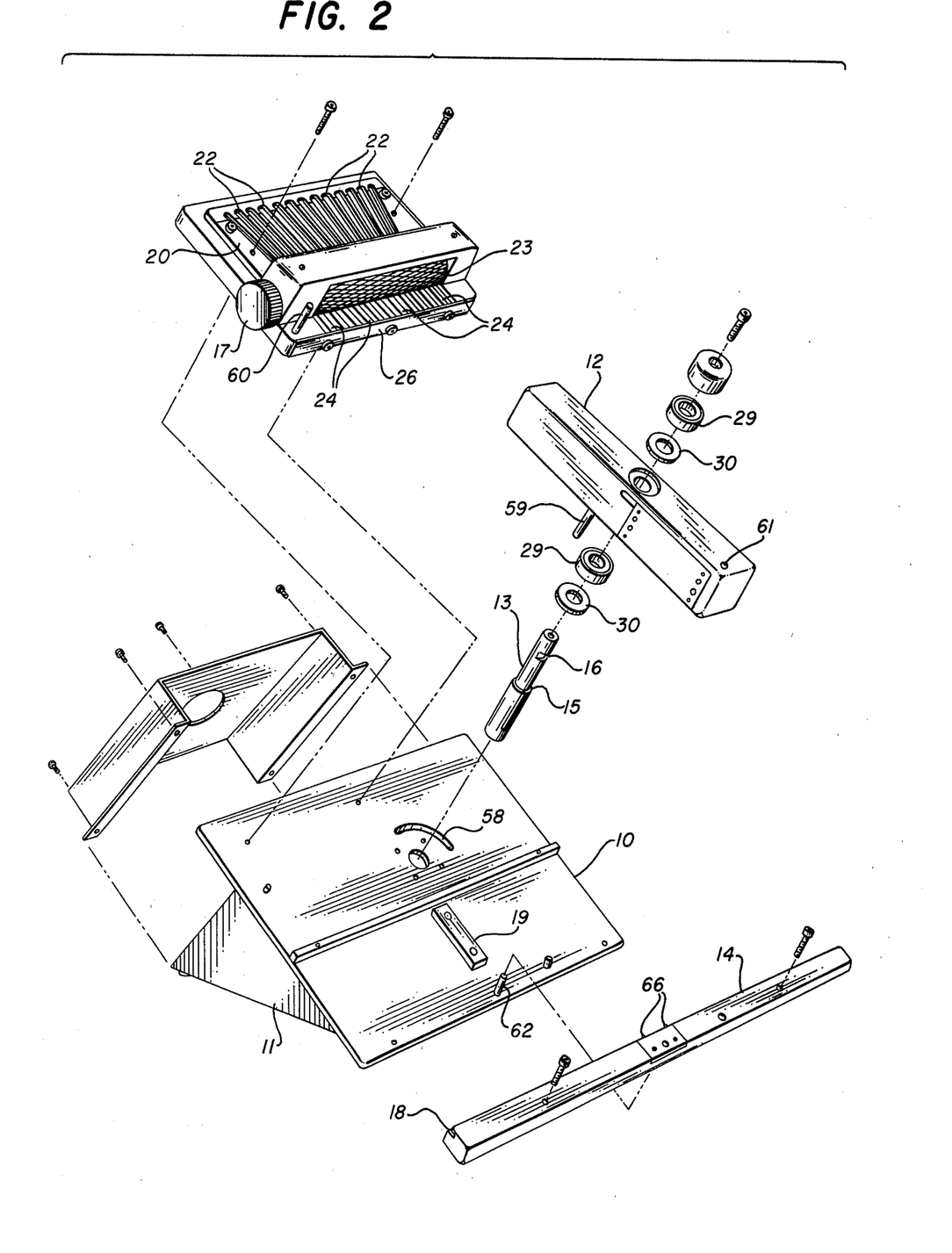
FIG. 2 is an exploded view of the apparatus of FIG. 1 showing the relationship of the major components thereof.

As illustrated in FIGS. 1 and 2, the preferred embodiment of apparatus employing the invention includes an inclined table 10 supported by a base 11. A transfer arm 12 is mounted for rotation on a rotationally fixed shaft 13 between a second position as illustrated in FIG. 1 and a first position 90° from the second position as illustrated by the arrow in FIG. 1. A burn-in board or the like (not illustrated) is positioned on the table 1 and held in alignment with the table by an alignment bar 14.

The conventional burn-in board comprises a support medium such as a printed circuit board or the like with a plurality of sockets arranged in rows and columns on one face thereof. The sockets are electrically interconnected to contact pads or pins on the board for applying the desired test signals to the DIPs. In order to align each row of sockets with the loading position of the transfer arm as will be explained hereinafter, the alignment bar 14 has an axial groove 18 in the edge face thereof which lies perpendicular to the table 10. Thus the edge of the burn-in board may be inserted into the groove 18 and the board moved horizontally across the table by sliding the edge of the board through groove 18. A support 19 carried on the face of the table 10 is aligned directly under the row of sockets to be loaded and thus supports the board and the sockets during insertion of the DIPs thereinto. The alignment bar 14 carries a pair of pointed indexing pins 66 directly above the groove 18 projecting toward the sockets carried on the board. The indexing pins are spaced apart by the length of the socket and equidistant from registry pin 62 which mates with the loading arm as described hereinafter. Accordingly, a row of sockets is placed in registry with the registry pin 62 by moving the burn-in board laterally through groove 18 until the lower socket in a row of sockets is indexed between indexing pins 66.

A feeder rack 20 mounted on table 10 receives DIPs from a plurality of conventional DIP transport tubes 21. The feeder rack 20 employs an inclined plate having a plurality of alignment rails or channels 22 adapted to receive DIPs from the transport tubes 21 and feed the DIPs across the plate toward a metering roller 23. The rails 22 are not parallel. Instead, the upper ends of the rails 22 are adapted to receive the transport tubes and are spaced apart sufficiently to receive the ends of the transport tubes 21 while the opposite ends of the rails 22 converge to direct the DIPs passing thereover into appropriately spaced loading stations 24. Each loading station 24 comprises an island at the lower end of rails 22 projecting upwardly between the pins of the DIP so that the DIP, when resting against the end plate 26, is properly aligned to be received by the transfer rack and is spaced and positioned with respect to other DIPs in the loading stations in the relationship which it will occupy when inserted into the burn-in board. The row of DIPs in the loading stations, however, are spaced from and aligned in a row 90° from the corresponding row of sockets into which the DIPs are to be inserted. A vibrator 68 is attached to the underside of the feeder rack 20 and, since the feeder rack plate is inclined, DIPs are fed by gravity from the transport tubes 21 onto the rails 22 and across the rails 22 on the plate toward the metering roller 23.

Metering roller 23 is a resilient cylinder, such as soft rubber or the like, mounted on axle 25 supported transversely across the lower ends of rails 22. The surface of roller 23 is spaced from the rails 22 sufficiently to permit DIPs to pass thereunder when the roller is rotated but prevent DIPs from passing thereunder unless the roller 23 is rotated. Thus rotation of roller 23 serves to simultaneously meter the transfer of one DIP from each rail 22 into a loading station 24. It will be observed that when the DIPs are positioned in loading stations 24, they are spaced and aligned with respect to each other in the same positions that they will occupy when inserted into the sockets in the burn-in board. Furthermore, the row of DIPs in the loading stations 24 lie in the same plane as the sockets on the burn-in board, but the row of DIPs is aligned 90° from the row of sockets into which they are to be positioned and spaced from the shaft 13 by the same distance as the corresponding sockets into which they are to be inserted. Thus, each DIP may be inserted into its corresponding socket by moving it in a 90° arc about the shaft 13. However, the DIP must be raised from the loading station and lowered into the corresponding socket.

As illustrated in FIG. 2 the transfer arm 12 is an elongated arm mounted parallel with table 10 and pivotable about shaft 13. The lower end of shaft 13 is enlarged to form a face 15 and the enlarged end thereof mounted in a bushing below the table 10. The shaft is suitably keyed or slotted to prevent rotation thereof and mounted to permit axial movement thereof between a first (raised) position and a second (lowered) position. The transfer arm 13 is journaled for rotation about shaft 13 by means of suitable bearings 29 and bearing plates 30. Thus transfer arm 12 may rotate about shaft 13 and is raised and lowered with respect to table 10 as shaft 13 is moved axially between first and second axial positions.

Figure 6:
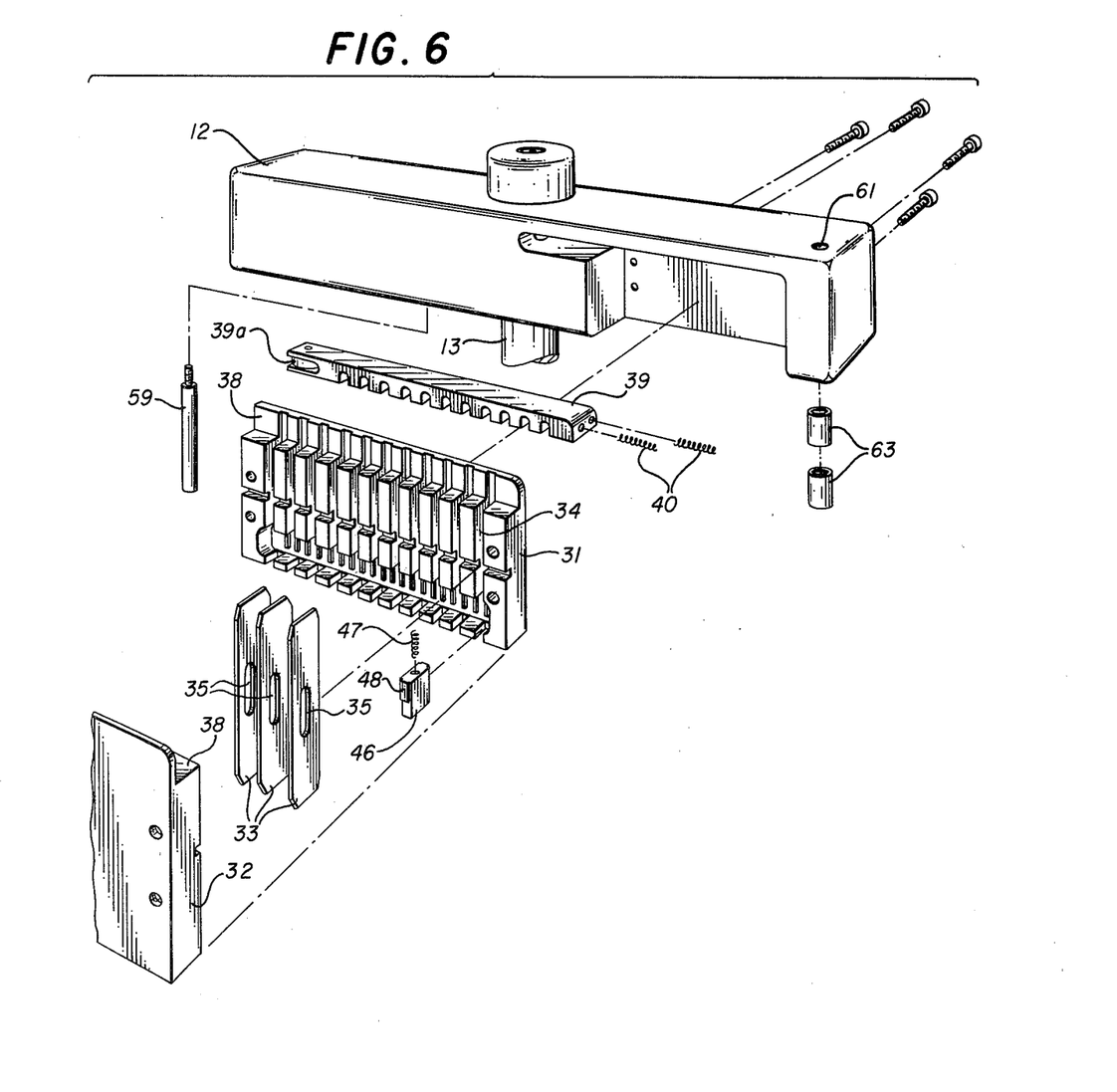
FIG. 6 is an exploded view illustrating the relationship of the components of the transfer arm.
Figure 7:
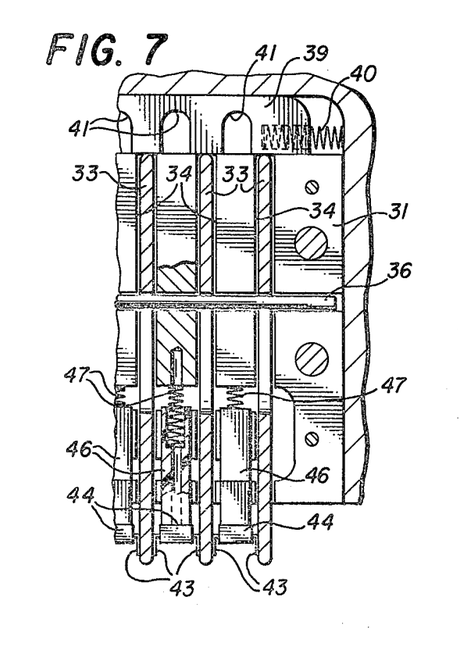
FIGS. 7 and 8 are sectional views of the transfer rack carried by the transfer arm showing the respective positions of the parts thereof during operation of the apparatus.
Figure 8:
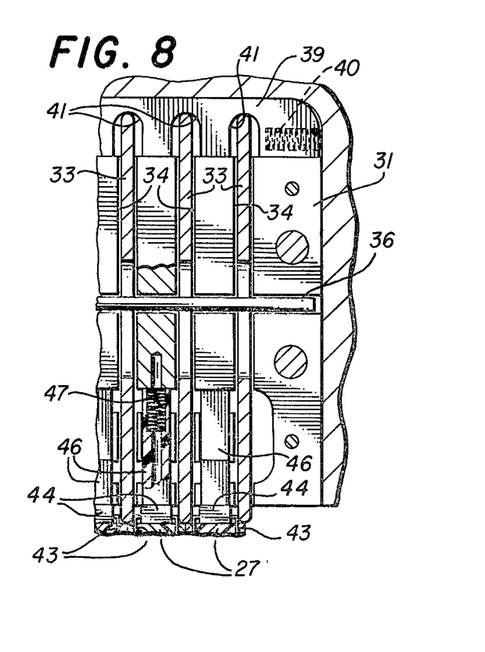

As illustrated in FIGS. 6, 7 and 8, transfer arm 12 carries a transfer rack comprising a pair of opposed grooved plates 31 and 32 supporting elongated fingers or blades 33 in grooves 34. It will be observed that plates 31 and 32 are mating mirror images of each other and, when assembled, grooves 34 form channels in which blades 33 may reciprocate. In their lowered or extended positions, the lower ends of blades 33 extend from the lower end of the transfer rack. Accordingly, to retain the blades 33 within the housing, an elongaed slot 35 is centrally formed in each blade 33 and a retaining pin 36 carried by the housing formed by the plates 31 and 32 passes transversely through slots 35. The blades 33 are thus retained within the housing formed by plates 31 and 32 but are free to reciprocate within the channels formed by grooves 34.

Referring now to FIG. 6, it will be observed that plates 31 and 32 each have a recess horizontally traversing the top surface thereof so that when plates 31 and 32 are mated together the recesses form a transverse channel 38. A blade locking means comprising a cam follower 39 is positioned for transverse reciprocal movement within channel 38 and urged toward shaft 13 by springs 40. The cam follower is thus urged toward a first position by springs 40 but may move to a second position by compression of springs 40. The face of cam follower 39 facing grooves 34 is provided with spaced recesses 41 which align with the ends of the channels formed by grooves 34 when the cam follower is in the second position as illustrated in FIG. 8. When the cam follower is in the first position, the upper ends of the channels are blocked by the cam follower 39 as illustrated in FIG. 7, thus preventing upward travel of the blades 33 and locking the blades 33 in the extended position.

Referring again to FIG. 2, it will be observed that shaft 13 is eccentrically notched at 16 to form a camming surface. Cam follower 39 carries a camming roller 39a which engages camming surface 16 and thus causes the cam follower 39 to reciprocate axially with respect to arm 12 (and radially with respect to the shaft 13) between a first position (as illustrated in FIG. 7) and a second position (as illustrated in FIG. 8) as the transfer arm 12 is rotated from a first position (aligned with the loading stations 24) and a second position (aligned with the row of sockets in the burn-in board).

In operation, the transfer arm 12 is pivoted about shaft 13 until it is aligned with a row of DIPs in the loading stations 24. When the transfer arm 12 is thus aligned, the blades 33 are, by gravitational forces only, extended from the lower ends of the grooves 34 and the cam follower 39 shifted to the first position as shown in FIG. 7. Accordingly, as the shaft 13 is retracted, arm 12 is moved downwardly toward the loading stations. Since the top ends of channels 34 are blocked by cam follower 39, the blades 33 are forced between the pins 43 of adjacent DIPs 44 and the DIPs 44 are securely held therebetween. As is well-known to those skilled in the art, the pins extending from the DIP body are positioned in rows extending laterally from opposite sides of the body and each lateral row of pins is bent downwardly. However, in the as-manufactured condition, the pins are not bent 90° to form two parallel vertical rows of pins. Instead, the downwardly projecting portions of the pins in each row are splayed outwardly from the DIP body. Thus, as the blades 33 are positioned on opposite sides of a DIP, the splayed portions of the pins are pressed inwardly and each DIP is held between the opposed parallel faces of two blades by the spring-like tendency of the pins to return to the as-manufactured splayed angle. The DIPs are thus held firmly between the blades 33 by the spring-like action of the pins. As the arm 12 is lifted, the DIPs 44 are lifted from the loading stations and held in proper alignment and spacing with respect to each other with the pins held in substantially parallel rows. The arm is then rotated 90° (counterclockwise in FIG. 1) to align the row of DIPs with a corresponding row of sockets 27 on the burn-in board.

It will be observed that as the transfer arm 12 is pivoted about shaft 13, the cam follower 39 follows the camming surface 16 on shaft 13 and thus moves from the first position as shown in FIG. 7 to the second position as shown in FIG. 8. However, the blades 33 carrying the DIPs 44 remain extended merely by the force of gravity thereon. Thus DIPs 44 remain firmly grasped between the blades 33. When the arm 12 reaches the second position, pins 43 on the DIP bodies are aligned with sockets 27 on the burn-in board.

As shaft 13 is again retracted, arm 12 is lowered toward the burn-in board. As the arm 12 is lowered toward the burn-in board by retracting shaft 13 axially, blades 33 engage the top surfaces of the sockets 27 on the burn-in board and are displaced upwardly into recesses 41. Thus, as the blades 33 retract, the DIPs 44 are released.

A plunger 46 carried by the transfer rack is aligned with blades 33 and mounted for reciprocal movement between each pair of blades 33. Each plunger 46 carries a pair of laterally extending retaining shoulders 48 which ride in mating slots in plates 31 and 32 and is urged downwardly by a spring 47. In the unloaded condition, the plunger 46 extends from the lower edge of the transfer rack. However, when the transfer arm is rotated to the first position and lowered to load the DIPs 44 between the blades 33, the plunger 46 engages the topside of the DIP and is urged upwardly into the rack by partially compressing spring 47. However, the expansion force exerted by spring 47 is insufficient to dislodge the DIP 44 from between the blades 33. When the arm 12 is lowered to insert the DIPs into the sockets 27, the pins 43 are aligned with the sockets 27 on the burn-in board and the DIP pins thus inserted into the sockets by the pressure exerted thereon by spring 47. However, if the pins are bent or misaligned, the plunger 46 is urged upwardly to further compress spring 47 and the DIP with misaligned leads merely rests on top of the socket 27. Therefore, the DIP is not damaged. Instead, the DIP is merely deposited on the burn-in board socket without inserting the leads into the socket. As the arm 12 is raised, the blades 33 are again allowed to extend from the transfer rack by the force of gravity and the arm is ready for a repeat cycle.

It will be observed that in no case is any vertical pressure exerted on the DIP other than the pressure exerted by the compression of spring 47. Thus, by adjusting the compression strength of spring 47, the pressure on the DIP can be carefully controlled to avoid damage to the DIP or the DIP pins.

Figure 3:
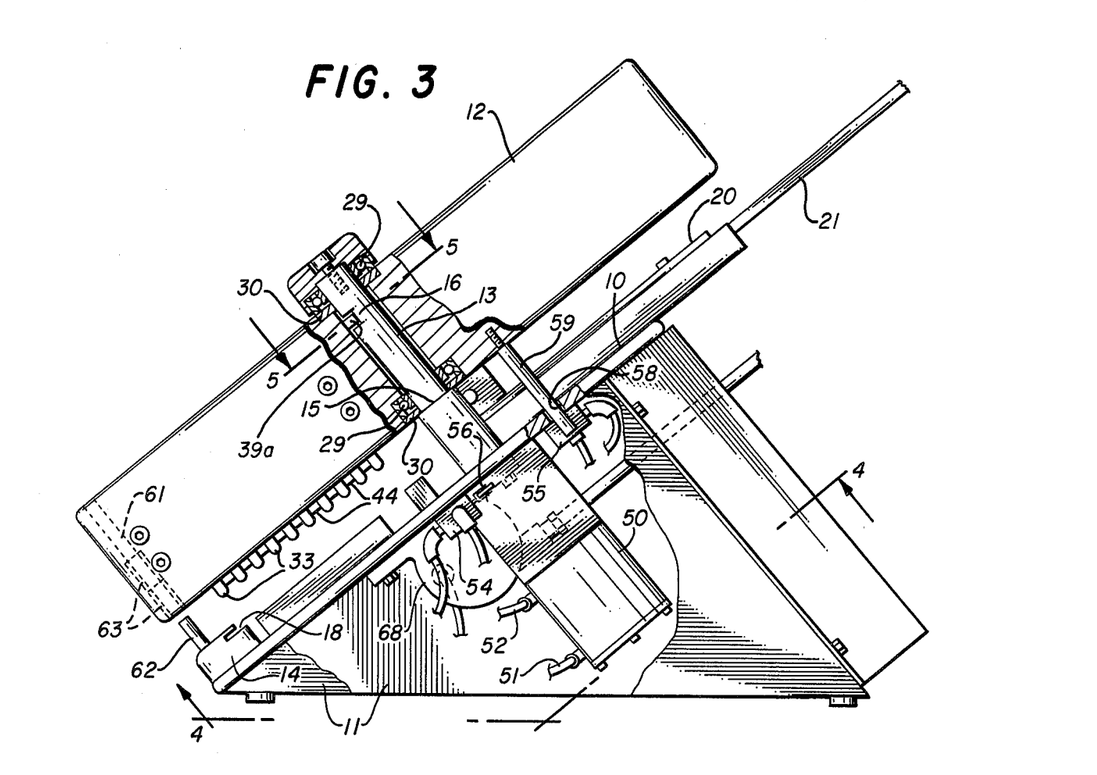
FIG. 3 is a partially cutaway side view of the apparatus of FIG. 1.
Figure 4:
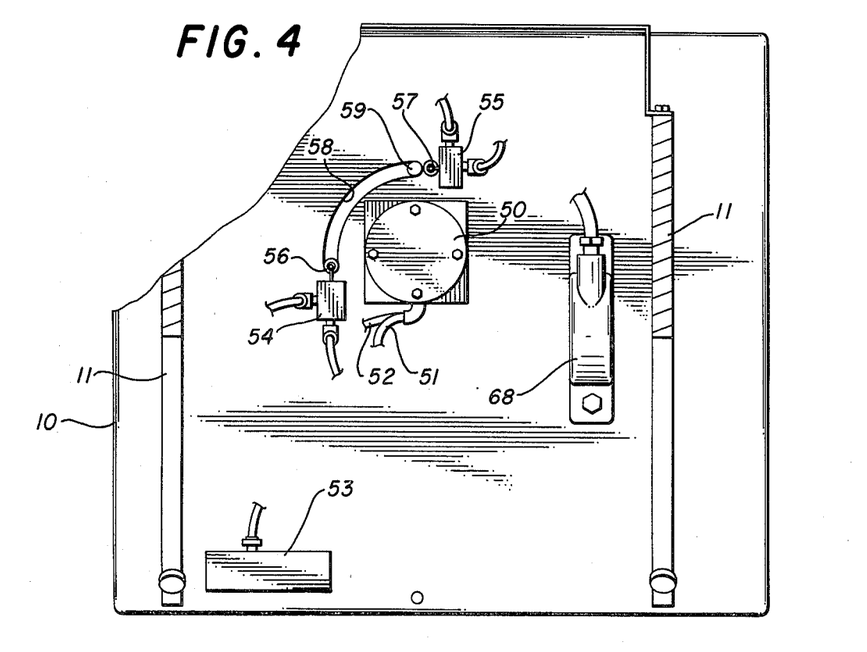
FIG. 4 is a sectional view of the apparatus of FIG. 3 taken through lines 4—4.
Figure 5:
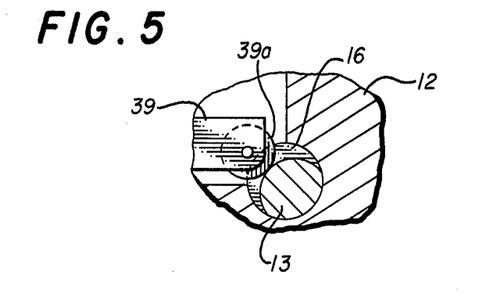
FIG. 5 is a sectional view of the transfer arm hub taken through lines 5—5.

Axial movement of shaft 13 to raise and lower the arm 12 may be accomplished manually or automatically. In the preferred embodiment, the shaft 13 is coupled to a two-position air-operated piston and cylinder assembly generally indicated at 50 in FIG. 3 so that when compressed air is injected through line 52 with line 51 vented, the shaft 13 is moved axially downwardly to lower the arm 12. Likewise, when air is injected through line 51 with line 52 vented, shaft 13 is moved axially upwardly and arm 12 is raised. In the embodiment illustrated, compressed air from a compressed air source (not illustrated) is directed through switch valve 53 and safety valves 54 and 55 (see FIGS. 3 and 4). Valves 53, 54 and 55 are interconnected with the compressed air lines controlling piston and cylinder assembly 50 so that the arm 12 is lowered only when valve 53 is opened and either valve 54 or 55 is open. Valves 54 and 55 are normally closed valves with activating switches 56 and 57, respectively, extending therefrom and arranged adjacent opposite ends of an arcuate slot 58 in the table 10. A pin 59 extending from the underside of arm 12 traverses arcuate slot 58 as arm 12 is rotated. Thus it will be observed that when arm 12 is rotated to the first position for receiving DIPs from the loading stations, pin 59 engages switch 57 to open valve 55. Accordingly, when switch valve 53 is activated, the arm 12 will be lowered to engage the DIPs in the loading stations. When switch valve 53 is closed, the arm 12 is automatically raised and is ready for rotation to transport the DIPs into alignment with the receiving sockets 27 on the burn-in board. As the arm 12 is rotated, pin 59 traverses arcuate slot 58 and, when the DIPs are properly aligned over the sockets 27 in the burn-in board, the pin 59 engages switch 56 to open valve 54. Accordingly, when switch valve 53 is opened, the arm is again lowered to permit insertion of the DIP pins into the sockets 27. It will therefore be observed that the shaft 13 can be moved axially (and thus the arm 12 raised and lowered with respect to the table) only when the arm 12 is either in the first position or the second position but not therebetween. To further insure that the arm 12 is properly aligned in register with the loading stations and the receiving sockets, a registry pin 60 must mate with a hole 61 in the end of the transfer arm 12 when the arm is in the first position and a similar registry pin 62 must mate with the same hole 61 when the arm 12 is in the second (DIP insertion) position. The registry pins 60 and 62 thus serve to insure that proper alignment is maintained in both positions. As illustrated in FIG. 6, hole 61 may be provided with replaceable bushings 63 to insure that the apparatus is always properly aligned.

As pointed out hereinabove, rotation of metering roller 23 automatically meters one row of DIPs from the alignment rails 22 into the loading stations 24. In the embodiment illustrated, axle 25 carrying roller 23 is provided with a rotating drum 17 which is attached to axle 25 by means of a unidirectional clutch. The clutch permits the drum 17 to rotate in one direction without rotating axle 25 but causes rotation of axle 25 when rotated in the opposite direction. The outer edge of drum 17 is positioned to engage one side of transfer arm 12 when transfer arm 12 is above the loading stations. Accordingly, when arm 12 is lowered to receive the row of DIPs in the loading stations 24, drum 17 is rotated (clockwise as illustrated in FIG. 2) without rotation of the metering roller 23. However, as the arm 12 is raised, the drum 17 is rotated in the opposite direction (counterclockwise as illustrated in FIG. 2), thus simultaneously metering a row of DIPs into the loading stations 24 for the next loading operation.

It will be observed that the DIPs 44 are individually arranged in the loading stations in the positions they will occupy with respect to each other when inserted into the sockets 27 and maintained in their respective positions with respect to each other during transfer. Thus the thickness of blades 33 is determined by the spacing between adjacent DIPs. It will be further noted that the blades 33 are inserted vertically with respect to the DIPs between the pins of adjacent DIPs so that each DIP is grasped by the blades only on the vertical sides of the pins. Thus, if any pin is bent further outwardly than the other pins when the DIP is in the loading station, insertion of the blades 33 between the DIPs will serve to straighten the pin. Furthermore, it will be observed that the blades 33 are symmetrical about slots 35. Thus, if the blades become worn on the pin-engaging surfaces, the blades may be reversed. Thus each blade has a double wear life-time.

While the apparatus has been described with reference to DIPs, it will be appreciated that the invention is not so limited. Other circuit packages may be transferred by suitable modification of the apparatus without departing from the principles of the invention. For example, DIPs are commonly manufactured in plastic packages and ceramic packages, the plastic package being thicker in the vertical dimension than the ceramic package. If desired, the plate on feeder rack 20 may be reversible with channels or rails on one side thereof adapted to receive ceramic packages and channels on the opposite side adapted to receive plastic packages. Thus the feeder plate may be simply reversed to convert the apparatus to handle either ceramic or plastic packages.

It will be observed that the transfer arm 12 is an elongated arm which pivots about the shaft 13. In the preferred embodiment, the transfer rack assembly is carried by one segment of the arm 12 and the segment of the arm extending in the opposite direction from the pivot point serves as a counterbalance and as a handle for manual operation of the apparatus. In the apparatus illustrated, transfer arm 12 is rotated manually and shaft 13 moved axially by an air cylinder. This embodiment is thus extremely maintenance-free and adaptable for use in any testing facility. Obviously, rotation of the transfer arm, activation of the arm lifting apparatus, and repositioning of the burn-in board between loading cycles may be automated by conventional means if desired. However, the embodiment illustrated provides extreme simplicity of operation and low-cost investment. Accordingly, it is to be understood that although the invention has been described with particular reference to a specific embodiment thereof, various changes and modifications may be resorted to without departing from the spirit and scope of the invention as defined by the appended claims.

What is claimed is:

1. Apparatus for simultaneously loading a plurality of circuit packages in a plurality of receiving sockets comprising:

(a) means for receiving a plurality of circuit packages and directing said packages toward a plurality of loading stations;
    (b) metering means for simultaneously transferring one circuit package from each of the receiving and directing means into a loading station wherein said circuit packages occupy the positions with respect to each other that they will occupy when positioned in their respective receiving sockets;
    (c) rack means for simultaneously lifting said plurality of circuit packages from said loading stations;
    (d) transfer means for moving said rack means from said loading stations and aligning said circuit packages with said receiving sockets; and
    (e) means for simultaneously inserting said plurality of circuit packages into said receiving sockets.

2. Apparatus as defined in claim 1 wherein said means for receiving a plurality of circuit packages and directing said packages toward a plurality of loading stations comprises a plurality of inclined rails.

3. Apparatus as defined in claim 2 wherein said metering means comprises cylindrical means supported transversely to said inclined rails and spaced therefrom a sufficient distance to prevent said circuit packages from traversing said rails unless said cylindrical means is rotated and to permit circuit packages to move across said rails into said loading stations when said cylindrical means is rotated.

4. Apparatus as defined in claim 1 including means for positioning a plurality of receiving sockets in spaced relation to said loading stations.

5. Apparatus as defined in claim 4 wherein said rack means comprises:

(a) a housing having a plurality of parallel channels;
    (b) elongated blade means mounted for reciprocal movement within each of said channels between a first extended position and a second retracted position, said elongated blade means having substantially parallel faces positioned and spaced to grip said circuit packages between the parallel faces of the ends of said elongated blade means; and
    (c) blade locking means reciprocal between a first position and a second position for locking said elongated blade means in said first extended position when said blade locking means is in said first position and for permitting said blade means to reciprocate between said first extended position and said second retracted position when said blade locking means is in said second position.

6. Apparatus as defined in claim 5 including plunger means positioned intermediate and parallel with said elongated blade means and reciprocal between an extended position and a retracted position, each said plunger means having spring means resiliently urging said plunger means toward said extended position.

7. Apparatus as defined in claim 4 wherein said transfer means comprises a transfer arm pivotal about a shaft between a first arm position and a second arm position, said first arm position aligning said rack means with circuit packages in said loading stations and said second arm position aligning said rack means with said receiving sockets.

8. Apparatus as defined in claim 7 including means for reciprocally moving said transfer arm axially with respect to the axis of said shaft between a lowered position and an elevated position when said rack means is aligned with said loading stations and when said rack means is aligned with said receiving sockets.

9. Apparatus as defined in claim 5 wherein said transfer means comprises a transfer arm pivotal about a shaft between a first arm position and a second arm position, said first arm position aligning said rack means with circuit packages in said loading stations and said second arm position aligning said rack means with said receiving sockets.

10. Apparatus as defined in claim 9 wherein said shaft includes a camming surface and said blade locking means comprises a cam follower mounted axially with respect to said transfer arm and spring means resiliently urging said cam follower toward said camming surface, said cam follower having a plurality of recesses therein which align with the ends of said blade means when said rack means is aligned with said receiving sockets, thereby permitting said blades to move from said first extended position to said second retracted position when said rack means is aligned with said receiving sockets, said cam follower further including means for locking said blades in said first extended position when said rack means is aligned with said loading stations.

11. Apparatus as defined in claim 8 including switch means operative to permit axial movement of said shaft only when said rack means is aligned with said loading stations and when said rack means is aligned with said receiving sockets.

12. Apparatus for simultaneously transferring a plurality of DIPs aligned in a row in a plurality of loading stations from said loading stations to a plurality of arranged to receive said plurality of DIPs in relationship with respect to each other as said DIPs occupy in said loading stations, said apparatus comprising;
 (a) a housing moveable vertically with respect to the plane of the top surfaces of said DIPs and having a plurality of parallel channels therein;
 (b) a plurality of elongated blades means mounted for reciprocal movement in said channels between a first position and a second position, said blade means extending from said housing at least when in said first position and having substantially flat parallel faces adjacent the ends thereof, the flat parallel faces of said blades being spaced apart and adapted to mate with and grip the opposite sides of said DIPs; and
 (c) means for locking said plurality of blades in said first position when said blades are aligned with said DIPs in said loading stations and for permitting said blades to move to said second position when said DIPs are aligned with said sockets.

13. Apparatus as defined in claim 12 including plunger means positioned intermediate and parallel with said elongated blade means and reciprocal between an extended position and a retracted position, each said plunger means having spring means resiliently urging said plunger means toward said extended position.

14. Apparatus for simultaneously loading a plurality of circuit packages in a plurality of receiving sockets comprising:
 (a) means for arranging a plurality of circuit packages in loading stations with the said packages spaced and aligned with respect to each other in the respective positions each package will occupy when positioned in its respective receiving socket;
 (b) rack means for simultaneously lifting said plurality of circuit packages from said loading stations, said rack means comprising:
  (i) a housing having a plurality of parallel channels;
  (ii) enlongated blade means mounted for reciprocal movement within each of said channels between a first extended position and a second retracted position, said elongated blade means having substantially parallel faces positioned and spaced to grip said circuit packages between the parallel faces of the ends of said elongated blade means; and
  (iii) blade locking means reciprocal between a first position and a second position for locking said elongated blade means in said first extended position when said blade locking means is in said first position and for permitting said blade means to reciprocate between said first extended position and said second retracted position when said blade locking means is in said second position;
 (c) means for positioning a plurality of receiving sockets in spaced relation to said loading stations;
 (d) transfer means for moving said rack means from said loading stations and aligning said circuit packages with said receiving sockets; and
 (e) means for simultaneously inserting said plurality of circuit packages into said receiving sockets.

15. Apparatus as defined in claim 14 including plunger means positioned intermediate and parallel with said elongated blade means and reciprocal between an extended position and a retracted position, each said plunger means having spring means resiliently urging said plunger means toward said extended position.

16. Apparatus as defined in claim 14 wherein said transfer means comprises a transfer arm pivotal about a shaft between a first arm position and a second arm position, said first arm position aligning said rack means with circuit packages in said loading stations and said second arm position aligning said rack means with said receiving sockets.

17. Apparatus as defined in claim 16 including means for reciprocally moving said transfer arm axially with respect to the axis of said shaft between a lowered position and an elevated position when said rack means is aligned with said loading stations and when said rack means is aligned with said receiving sockets.

18. Apparatus as defined in claim 14 wherein said transfer means comprises a transfer arm pivotal about a shaft between a first arm position and a second arm position, said first arm position aligning said rack means with circuit packages in said loading stations and said second arm position aligning said rack means with said receiving sockets.

19. Apparatus as defined in claim 18 wherein said shaft includes a camming surface and said blade locking means comprises a cam follower mounted axially with respect to said transfer arm and spring means resiliently urging said cam follower toward said camming surface, said cam follower having a plurality of recesses therein which align with the ends of said blade means when said rack means is aligned with said receiving sockets, thereby permitting said blades to move from said first extended position to said second retracted position when said rack means is aligned with said receiving sockets, said cam follower further including means for locking said blades in said first extended position when said rack means is aligned with said loading stations.

20. Apparatus as defined in claim 17 including switch means operative to permit axial movement of said shaft only when said rack means is aligned with said loading stations and when said rack means is aligned with said receiving sockets.

21. Apparatus for simultaneously loading a plurality of circuit packages in a plurality of receiving sockets comprising:
(a) means for arranging a plurality of circuit packages in loading stations with the said packages spaced and aligned with respect to each other in the respective positions each package will occupy when positioned in its respective receiving socket;
(b) rack means for simultaneously lifting said plurality of circuit packages from said loading stations;
(c) transfer means for moving said rack means from said loading stations and aligning said circuit packages with said receiving sockets comprising a transfer arm pivotal about a shaft between a first arm position and a second arm position, said first arm position aligning said rack means with circuit packages in said loading stations and said second arm position aligning said rack means with said receiving sockets;
(d) means for reciprocally moving said transfer arm axially with respect to the axis of said shaft between a lowered position and an elevated position when said rack means is aligned with said loading stations and when said rack means is aligned with said receiving sockets;
(e) means for simultaneously inserting said plurality of circuit packages into said receiving sockets; and
(f) means for positioning a plurality of receiving sockets in spaced relation to said loading stations.

22. Apparatus as defined in claim 21 including switch means operative to permit axial movement of said shaft only when said rack means is aligned with said loading stations and when said rack means is aligned with said receiving sockets.

* * * * *

UNITED STATES PATENT AND TRADEMARK OFFICE
CERTIFICATE OF CORRECTION

PATENT NO. : 4,370,805

DATED : February 1, 1983

INVENTOR(S) : Wayne F. Pfaff

It is certified that error appears in the above-identified patent and that said Letters Patent are hereby corrected as shown below:

In Column 4, line 22, "elongaed" should read ---elongated---

In Column 9, line 31, ---sockets--- should be inserted after "of"

Signed and Sealed this

Fifth Day of April 1983

[SEAL]

Attest:

Attesting Officer

GERALD J. MOSSINGHOFF

Commissioner of Patents and Trademarks